United States Patent [19]

Ebata et al.

[11] Patent Number: 4,631,099

[45] Date of Patent: Dec. 23, 1986

[54] METHOD FOR ADHESION OF OXIDE TYPE CERAMICS WITH COPPER OR ALLOY THEREOF

[75] Inventors: Yoshihiro Ebata, Kawanishi; Saburo Kose, Ikeda; Ryozo Hayami, Takarazuka, all of Japan

[73] Assignee: Agency of Industrial Science & Technology, Tokyo, Japan

[21] Appl. No.: 688,930

[22] Filed: Jan. 4, 1985

[51] Int. Cl.$^4$ .............................................. B32B 31/24
[52] U.S. Cl. ..................................... 156/89; 228/120; 228/196; 228/199; 228/200; 228/903
[58] Field of Search ................... 156/89; 228/120, 122, 228/124, 188, 195, 196, 199, 200, 903

[56] References Cited

U.S. PATENT DOCUMENTS 3,766,634 10/1973 Babcock et al. ...................... 228/188
4,505,418 3/1985 Neidig et al. ........................ 228/122

FOREIGN PATENT DOCUMENTS 595100 2/1978 U.S.S.R. ............................... 228/100

*Primary Examiner*—Caleb Weston
*Attorney, Agent, or Firm*—Armstrong, Nikaido, Marmelstein & Kubovcik

[57] ABSTRACT

A method for the adhesion of oxide type ceramics and copper or a copper alloy is provided by this invention, which method comprises placing the oxide type ceramics and the copper or copper alloy in mutual contact, heating them in an oxidative atmosphere thereby effecting adhesion thereof, and rapidly cooling the resultant composite of adhesion. The adhesive strength of the composite of adhesion so produced is about 40% higher than the adhesive strength of a similar composite of adhesion obtained by the conventional method involving gradual cooling.

12 Claims, No Drawings

METHOD FOR ADHESION OF OXIDE TYPE CERAMICS WITH COPPER OR ALLOY THEREOF

BACKGROUND

This invention relates to a method for the adhesion of oxide type ceramics and copper or a copper alloy, and more particularly, a method for causing oxide type ceramics and copper or a copper alloy to adhere to each other with extremely high strength by a simple procedure.

Generally ceramics is excellent in heat resistance, wear resistance, and insulation but vulnerable to impacts. When it is used as structural material, therefore, it is used more often in the form of a composite with a metallic substance than otherwise.

Ceramics is deficient in electroconductivity. When it is used in an application necessitating electroconductivity, it is similarly used in the form of a composite with a metallic substance.

The metal which meets these two requirements most faithfully is copper or a copper alloy. The composite of ceramics and copper or a copper alloy proves most useful in applications entailing these requirements.

The present inventors have conducted a series of study on methods for the adhesion of oxide type ceramics and copper or copper alloys. They have proposed a method which comprises heating a foam of oxide type ceramics-copper or copper alloy-nickel in an oxidative atmosphere without use of any adhesive agent and subsequently allowing the heated foam to cool off gradually as disclosed in Japanese Patent Publication No. 58-3999.

By this method obtained can be amply strong adhesion of oxide type ceramics and copper or a copper alloy. The inventors have made a further study for the purpose of developing means of improving the adhesive strength. They have consequently found a method capable of improving the adhesive strength by more than 40% as compared with the adhesive strength obtained by the steps of heating and gradual cooling. This knowledge has led to perfection of the present invention.

Specifically, this invention is accomplished by placing oxide type ceramics and copper or a copper alloy into mutual contact, heating them in situ in an oxidative atmosphere thereby causing adhesion thereof, and then rapidly cooling the resultant composite of adhesion.

SUMMARY

A first object of this invention is to produce adhesion of oxide type ceramics and copper or a copper alloy with notably high strength.

A further object of this invention is to effect adhesion of oxide type ceramics and copper or a copper alloy by a simple procedure.

THE PREFERRED EMBODIMENTS

In accordance with this invention, first an oxide type ceramics and copper or a copper alloy are brought into mutual contact and they are heated in oxidative atmosphere. The oxide type ceramics to be used in this invention is not specifically limited. Examples of the ceramics advantageously usable herein include alumina, silica, zirconia, mullite, barylia, magnesia, cordierite, lanthanum-chromite, and calcia.

The shape of the oxide type ceramics and that of copper or copper alloy are not specifically limited. They may be in the shape of cords, plates, rectangules, or tubes to permit effective adhesion.

The composition of the copper alloy may be widely varied. For example, copper-iron and copper-nickel can be advantageously used.

The temperature of heating is generally in the range of 1000° to 1200° C., and preferably 1050° to 1150° C. The time of heating is generally in the range of 5 to 60 minutes, and preferably 10 to 30 minutes. If the temperature is lower than 1000° C., the fusion layer of copper oxide which functions as adhesive agent on the surface of copper or copper alloy is formed with difficulty. If this temperature exceeds 1200° C., then the aforementioned fusion layer exhibits insufficient viscosity and entails the phenomenon of foaming and, consequently, fails to retain the original shape intact after the adhesion. Concrete examples of the oxidative gas are air, oxygen, a mixed gas of air and oxygen, and a mixed gas of an inert gas and oxygen. Air is advantageous over the other oxidative gases. By the heating, the copper or copper alloy is fused and caused to adhere to the oxide type ceramics to provide a composite bonded of the oxide type ceramics and copper or copper alloy.

Then, in this invention, the heated composite of adhesion is rapidly cooled. This rapid cooling is effected to lower the temperature of the composite of adhesion to at least 500° C., preferably at least 200° C.

If the temperature of the bonded composite after the rapid cooling is higher than 500° C., stress will possibly build up and the composite may sustain cracks and even breakage. The rate of this rapid cooling is generally in the range of 200° to 1000° C./sec, desirably 250° to 1000° C./sec, and more desirably 300° to 500° C./sec.

Generally, the adhesive strength of the produced composite increases in proportion as the rate of rapid cooling increases. If the rate of cooling exceeds 1000° C./sec., however, there ensues an undesirable possibility that, depending on the kind of the oxide type ceramics to be used, the adhesion composite will undergo cracks. If the rate of cooling fails to reach 200° C./sec, the improvement of adhesive strength which constitutes a primary object of this invention cannot be attained.

The manner in which the rapid cooling is effected is not specifically limited. For example, the rapid cooling may be effected by (1) allowing the composite taken out of a heating oven to be left standing in the draught, (2) taking the composite out of the heating oven and subsequently immersing it in ice water or oil, or (3) bringing the composite taken out of the heating oven into the ambient air and exposing it to a forced current of cooled air.

In accordance with the method of this invention, a three-layer composite can be obtained by placing an oxide type ceramics, copper or a copper alloy, and a metal such as nickel, iron, or an alloy thereof into mutual contact, heating them in the joined state, and rapidly cooling the heated composite of adhesion.

A constructional material formed of the three layer of an oxide type ceramics, copper or a copper alloy, and an oxide type ceramics can be manufactured by effecting adhesion in the same manner as described above.

Further, to the composite of an oxide type ceramics and copper or a copper alloy obtained in accordance with this invention, a varying metal may be bonded by any of the methods known to the art such as, for example, brazing.

In accordance with this invention, the adhesive strength between an oxide type ceramics and copper or a copper alloy can be notably increased by a simple procedure of placing the oxide type ceramics and the copper or copper alloy into mutual contact, heating them, and rapidly cooling as described above. The composite of adhesion so produced by this method exhibits an adhesive strength improved by about 40% as compared with the adhesive strength exhibited by a similar composite obtained by the conventional method of placing the oxide type ceramics and the copper or copper alloy into mutual contact, heating them, and gradually cooling. Now, this invention will be described more specifically below with reference to working examples.

EXAMPLE 1

Copper plates measuring 15 mm×15 mm×5 mm were severally placed in contact with alumina plates and zirconia plates both of the same dimensions and heated in air at varying temperatures ranging from 1090° to 1130° C. for 15 minutes. Then, the resultant composites of adhesion were immediately removed from the heating oven. They were rapidly cooled in a flow of air to room temperature (20° C.). The rate of cooling in this case was about 300° C./sec. The magnitudes of adhesive strength (tensile strength) exhibited by the cooled composites so obtained are shown in Table 1.

For comparison, the same heated composites of adhesion obtained under the same conditions as described above were left to gradually cool to room temperature (rate of cooling, 100° C./sec). The magnitudes of adhesive strength exhibited by the cooled composites are also shown in Table 1.

TABLE 1

| Oxide type ceramics | Temperature of heating (°C.) | Rapid cooling (adhesive strength, kg/cm$^2$) | Gradual cooling (adhesive strength, kg/cm$^2$) |
|---|---|---|---|
| alumina | 1130 | 480 | 330 |
| " | 1120 | 620 | 420 |
| " | 1100 | 630 | 420 |
| " | 1090 | 930 | 620 |
| zirconia | 1130 | 610 | 410 |
| " | 1120 | 690 | 460 |
| " | 1100 | 740 | 490 |
| " | 1090 | 980 | 680 |

It will be noted from Table 1 that the magnitudes of adhesive strengths exhibited by the composites obtained by the method of this invention involving rapid cooling are at least about 40% higher than those of the composites of adhesion obtained by the conventional method involving gradual cooling.

EXAMPLE 2

Copper alloy (Cu:Ni=70:30) plates of the same dimensions as the copper plates of Example 1 were severally placed in contact with alumina plates and zirconia plates of the same dimensions, heated, and then rapidly cooled under the same conditions as in Example 1. The magnitudes of adhesive strengths (tensile strengths) exhibited by the resultant composites are shown in Table 2 below. The magnitudes of adhesive strengths exhibited by similar composites obtained by heating under the same conditions and subsequent gradual cooling are also shown in the Table 2.

TABLE 2

| Oxide type ceramics | Temperature of heating (°C.) | Rapid cooling (adhesive strength, kg/cm$^2$) | Gradual cooling (adhesive strength, kg/cm$^2$) |
|---|---|---|---|
| alumina | 1130 | 370 | 190 |
| " | 1120 | 540 | 370 |
| " | 1100 | 602 | 405 |
| " | 1090 | 890 | 605 |
| zirconia | 1130 | 580 | 390 |
| " | 1120 | 620 | 405 |
| " | 1100 | 710 | 440 |
| " | 1090 | 880 | 640 |

It will be noted from the Table 2 that in the case of a copper alloy used in place of copper, too, the magnitudes of adhesive strengths attained according to the present invention are at least about 40% higher than those obtained by the conventional method involving gradual cooling.

We claim:

1. A method for the adhesion of oxide type ceramics and copper or a copper alloy, which comprises placing an oxide type ceramics and copper or a copper alloy in mutual contact, heating them in an oxidative atmosphere thereby effecting adhesion thereof, and subsequently cooling the resultant composite of adhesion at a cooling rate of at least 200° C./sec.

2. A method according to claim 1, wherein the temperature of said heating is in the range of 1000° to 1200° C.

3. A method according to claim 1, wherein the temperature of said heating is in the range of 1050° to 1150° C.

4. A method according to claim 1, wherein rapid cooling is effected by lowering the temperature of said heated composite of adhesion to at least 500° C.

5. A method according to claim 1, wherein the rate of cooling is in the range of 300° to 500° C./sec.

6. A method according to claim 1, wherein the rate of cooling is in the range of 200° to 1000° C./sec.

7. A method according to claim 1, wherein the rate of cooling is in the range of 250° to 1000° C./sec.

8. A method for the adhesion of oxide type ceramics with cooper and alloys thereof, comprising the steps of:
   contacting and heating an oxide type ceramic and copper or an alloy thereof at a temperature of 1000° to 1200° C. in an oxidative atmosphere, whereby said copper or alloy thereof fuses and adheres to said oxide type ceramic, and
   cooling the resulting composite of the oxide type ceramics and copper or alloy thereof to 500° C. or less at a rate of cooling of 200° to 1000° C./sec.

9. A method according to claim 8, wherein the rate of cooling is in the range of 300° to 500° C./sec.

10. A method according to claim 8, wherein the temperature of said heating is in the range of 1050° to 1150° C.

11. A method according to claim 8, wherein the resulting composite is cooled to 200° C. or less.

12. A method according to claim 8, wherein the rate of cooling is in the range of 250° to 1000° C./sec.

* * * * *